United States Patent [19]

Heck et al.

[11] Patent Number: 4,843,582
[45] Date of Patent: Jun. 27, 1989

[54] DIGITAL FILTER IN WHICH LINEAR COMBINATIONS OF POWERS OF TWO ARE CONVERTED TO BINARY NUMBERS USING WALLACE TREES

[75] Inventors: Berthold Heck; Joachim Speidel, both of Nürnberg, Fed. Rep. of Germany

[73] Assignee: U.S. Philips Corporation, New York, N.Y.

[21] Appl. No.: 58,294

[22] Filed: Jun. 5, 1987

[30] Foreign Application Priority Data

Jun. 10, 1986 [DE] Fed. Rep. of Germany ....... 3619425

[51] Int. Cl.$^4$ ............................................. G06F 15/31
[52] U.S. Cl. .............................................. 364/724.16
[58] Field of Search ........................... 364/724, 724.16

[56] References Cited

U.S. PATENT DOCUMENTS 4,484,299 11/1984 Lambourn et al. .................. 364/724

OTHER PUBLICATIONS

Ulbrich et al, "MOS-VLSI Pipelined Digital Filters for Video Applications", *Proceedings ICASSP* 84, San Diego, Ca. Mar. 19–21, 1984, pp. 44.7.1–44.7.4.
Tewksbury, et al, "FIR Digital Filters for High Sample Rate Application", *IEEE Communications Magazine* vol. 25, No. 7 Jul. 1987, pp. 62–72.

*Primary Examiner*—David H. Malzahn
*Attorney, Agent, or Firm*—Thomas A. Briody; Jack E. Haken; Jack D. Slobod

[57] ABSTRACT

A digital filter having K coefficients h(k) processes code words x(n-k), represented in the binary codes, of an input signal bit-parallel and uses filter coefficients h(k) represented in the CSD code. Substituting in the filter equation $$y(n) = \sum_{k=0}^{K-1} h(k)x(n-k)$$

the representation of the coefficients in the CSD code and the representation of the input code words in the binary code, the problem of converting a linear combination of powers of two, having arbitrary integral coefficients, into a binary number will occur repeatedly. Carrying out this conversion by means of cascades of Wallace Trees terminated by adders for two binary numbers results in a digital filter that is suitable for sampling rates up to 20 MHz and that can also be realized without any difficulty when an excess of 25 coefficients is needed for adhering to the required filter characteristic.

5 Claims, 3 Drawing Sheets

| h(k) \ p | CSD-Code 0 1 2 3 | Decimal |
|---|---|---|
| h(0)  | 0  0  0 -1 | -0,125 |
| h(1)  | 0  0  0  1 |  0,125 |
| h(2)  | 0  0 -1  0 | -0,250 |
| h(3)  | 0  1  0 -1 |  0,375 |
| h(4)  | 0  1  0  1 |  0,625 |
| h(5)  | 0 -1  0  0 | -0,500 |
| h(6)  | 0  0  1  0 |  0,250 |
| h(7)  | 1  0  1  0 |  1,250 |
| h(8)  | 1  0  1  0 |  1,250 |
| h(9)  | 0  0  1  0 |  0,250 |
| h(10) | 0 -1  0  0 | -0,500 |
| h(11) | 0  1  0  1 |  0,625 |
| h(12) | 0  1  0 -1 |  0,375 |
| h(13) | 0  0 -1  0 | -0,250 |
| h(14) | 0  0  0  1 |  0,125 |
| h(15) | 0  0  0 -1 | -0,125 |
| max $S^+_{w,p}$ | 2  4  4  4 | |
| max $S^-_{w,p}$ | 0  2  2  4 | |

FIG. 3

DIGITAL FILTER IN WHICH LINEAR COMBINATIONS OF POWERS OF TWO ARE CONVERTED TO BINARY NUMBERS USING WALLACE TREES

The invention relates to a digital filter having K coefficients, in which W-bit code words of an input signal are processed bit-parallel and the K filter coefficients are represented as P-digit words in the CSD code (Ganonical Signed Digit code).

A filter having the above features is described in an article by W. Ulbrich et al. (Ulbrich U., Noll, T. and Zehner, B.: "MOS-VLSI Pipelined Digital Filters for Video Applications", Proc. ICASSP 84, San Diego, CA, US, March 1984, pp. 44.7.1 to 44.7.4).

Digital filters can be designed in several ways. An outline of these design possibilities is given with reference to an example of a non-recursive filter whose time-domain characteristics are described by the output equation $$y(n) = \sum_{k=0}^{K-1} h(k)x(n-k) \quad (1)$$

where h(k) with k=0, 1, 2, ..., K-1 represents the K coefficients of the filter, x(n−k) represents the samples of the input signal at instants characterized by the variable integer n−k, and y(n) represents the output sample of the filter at instant n.

In the frequency-domain the filter is described by the Z-transform H(z) of h(k), referrd to as system function or transfer function $$H(z) = \sum_{k=0}^{K-1} h(k)z^{-k} \quad (2)$$

The different filter structures are obtained when the equations (1) or (2) are implemented in different ways. A direct implementation of equation (1) would be storing K consecutive input samples, multiplying each one of these samples by its associated filter coefficient and, subsequently, summing all products. However, such a design will lead to filters with a large number of components. Another way of implementing equation (1) is known by the term of "Distributed Arithmetic" (see, for example, Büttner, H. and Schüssler H. W.: "On Structures for the Implementation of the Distributed Arithmetic", Nachrichtentechn. Z., Vol. 29 (1976), No. 6, pp. 472-477). In the above article the samples are represented in a binary code. Products of filter coefficients and binary variables will then appear in equation (1). The variables are interpreted as variable addresses and applied to the address inputs of a ROM, whose output data represent the desired product in each individual case. Filters of such a structure have a drawback of reaching the storage capacity limits of currently available ROMs very quickly when the number of filter coefficients is increased.

Equation (2) can be implemented in two different ways. The first way leads to the so-called direct form of filter structures—they correspond to the direct implementation of equation (1)—and the second way, which formally corresponds to the implentation of the polynominal H(z) according to Horner's Method, leads to the so-called transposed direct form of filter structures. In contrast to the direct form, the transposed direct form is suitable for filters having a very high processing rate for two reasons. First, in a transposed direct form the required clocked delay elements are simultaneously utilized for temporarily storing intermediate results. This so-called pipelining compensates for the differences in propagation delay of the input signal bits processed in parallel with one another. Parallel processing is the second reason why this transposed direct form is suitable for high processing rates. The filter operates error-free if the propagation delays or the differences in propagation delay between two delay elements remain smaller than one period of the bit clock.

The filter described in the article by Ulbrich et al. is a filter of the transposed direct form type. In the above article the authors also propose to represent the filter coefficients in the CSD code (Canonical Signed Digit code). In this code, numbers are represented as linear combinations of powers of two—as in the binary code -, but unlike the binary code—the coefficients of the powers of two may assume the values of 0, 1 or −1. The CSD code is unambiguously reversible due to the additional requirement that two consecutive powers of two must not both have coefficients differing from zero. The CSD code is characterized in that it comprises the least number of ones for representing a number.

The invention has for its object to provide a filter based on the implementation of equation (1) and having the features mentioned in the opening paragraph, which filter has a novel structure differing from that of the currently known filters based on equation (1), and which filter is suitable for very high processing rates (sampling rates up to 20 MHz) and is also realizable with the means currently available for large numbers of filter coefficients (at least 25).

This object is achieved in that the code words of the input signal are shifted through a K-stage, W-digit wide shift register;

that two Wallace Trees are assigned to each number pair (p,w) where p=0, 1, 2, ... P-1 and w=0, 1, 2, ..., W-1;

that bit position w of stage k of the shift register for k=0, 1, 2, ... K-1 is connected to an input of the first Wallace Tree if digit position p of coefficient k is occupied by a +1, or is connected to an input of the second Wallace Tree if digit position p of the coefficient k is occpied by a −1;

that subsequent to all P first Wallace Tree having a fixed w and for all p, a first cascade of further Wallace Trees is connected, said first cascade performing a step-by-step conversion of each number, represented as a linear combination of P powers of two by the output variables of the P first Wallace Trees, into a binary number and said first cascade being terminated by a first adder for adding together two binary numbers so as to perform the last step of this conversion;

that the same holds for all P second Wallace Trees, a second cascade of further Wallace Trees and a second adder for adding together two binary numbers;

that subsequent to the W first adders a third cascade of Wallace Trees is connected, said third cascade performing a step-by-step conversion of each number, represented as a linear combination of W powers of two by the output variables of the W first adders, into a binary number and said third cascade being terminated by a third adder for adding together two binary numbers so as to perform the last step of this conversion;

that the same holds for the W second adders, a fourth cascade of Wallace Trees and a fourth adder for adding together two binary numbers; and that the outputs of the third and the fourth adders are connected to the inputs of a subtractor for subtracting two binary numbers, at the output of which the output variables of the filter are variable.

It is advantageous to use parallel transfer logic in the adders and subtracter. It is also advantageous to insert clocked intermediate stores between the cascades or between the individual stages of the cascades. It is also advantageous to select the filter coefficients to contain as many zeroes as possible within the prescribed tolerance scheme of the filter characteristic.

One exemplary embodiment of the invention will now be further described with reference to the Figures, in which:

FIG. 3 shows a Table of filter coefficients in the CSD code and in the decimal code.

Figure 1:
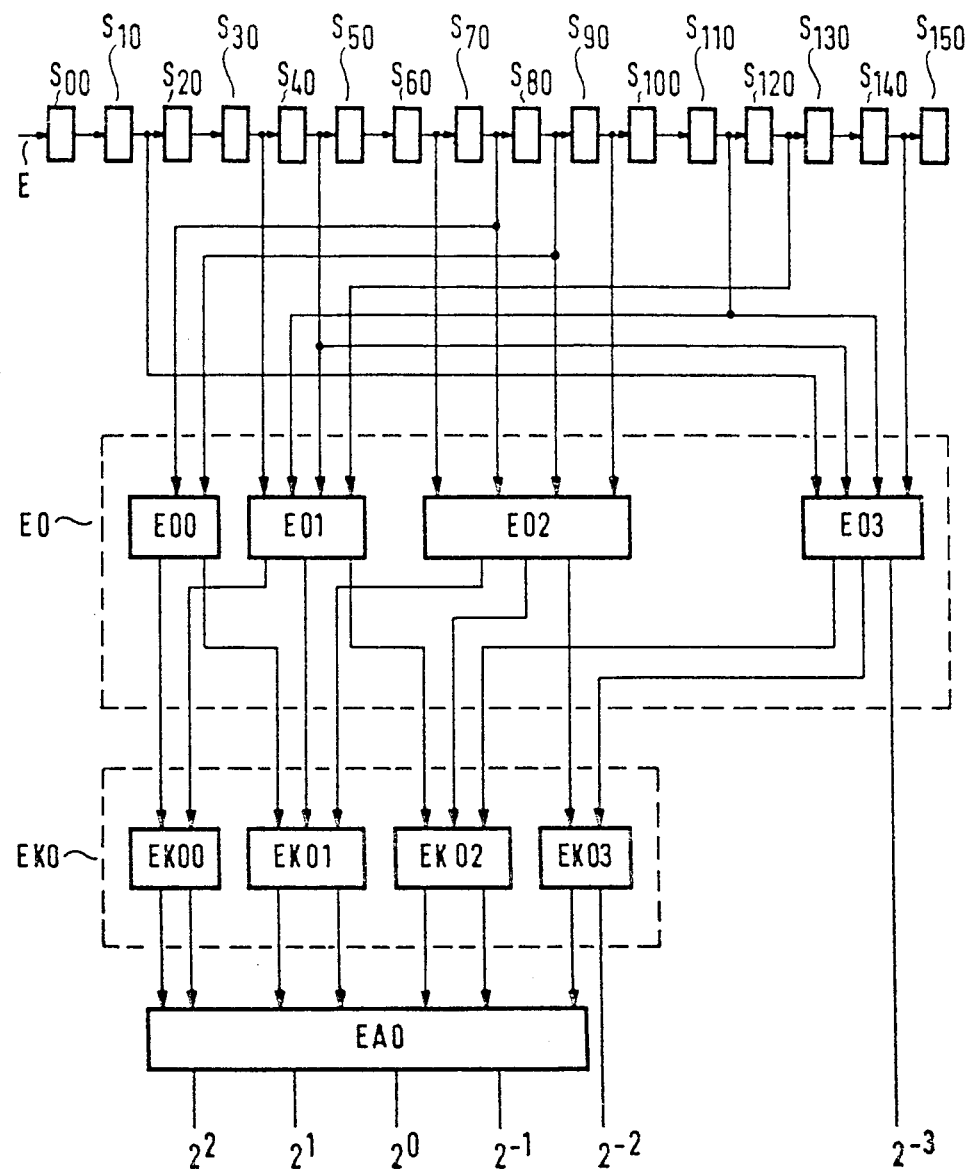
FIG. 1 shows details of an embodiment of the invention.

The non-recursive filter used as an embodiment has 16 coefficients (K=16), whose 4-digit (P=4) representation in the CSD code can be taken from the Table shown in FIG. 3.

The samples of the input signal consist of 8-digit (W=8) code words in binary code.

If the representation of the filter coefficients $$h(k) = \sum_{p=0}^{3} h_p(k) 2^{-p} \quad (3)$$

in the CSD code and the representation of the samples $$x(n - k) = \sum_{w=0}^{7} x_w(n - k) 2^{-w} \quad (4)$$

in the binary code are substituted in the equation (1), this will yield the triple sum $$y(n) = \sum_{w=0}^{7} \left[ \sum_{p=0}^{3} \left[ \sum_{k=0}^{15} h_p(k) x_w(n - k) \right] 2^{-p} \right] 2^{-w}, \quad (5)$$

where the ordering of brackets indicates the sequence of operations. First the implementation of the two innermost brackets will be considered in more detail, and that for w=0, i.e., for the bit having the weight of 2° in all 16 consecutive samples. Most components of the sum over k are zero due to $h_p(k)=0$. The remaining components can be combined to those for which $h_p(k)=1$, and to those for which $h_p(k)=-1$. When designating the partial sums over the positive $h_p(k)$ as $S^+_{0,p}$ and those over the negative $h_p(k)$ as $S^-_{0,p}$, the following can be noticed: the contribution to $S^=_{0,p}$ coming from filter coefficient k is $x_0(n-k)$ if there is a 1 in the digit position p of the coefficient $h(k)$; the largest value which $S^=_{0,p}$ can assume is available when there is a 1 in the digit position p of each filter coefficient and when all $x_0(n-k)$ for k=0, 1, 2, ..., 15 assume the value of 1. Actually, there is no digit position p which contains a one for each coefficient—as shown in the Table—but the maximum number of ones—as shown in the penultimate row of the Table—is less than 4 or equal to 4 for all digit positions. Consequently, $S^+_{d,p}$ cannot exceed 4.

For example, in order to compute $S^+_{0,0}$, as shown in FIG. 1, the binary values $x_0(n-k)$ stored in memory locations S00, S10, ... S150 are conveyed to the inputs of a first Wallace Tree E00 for those k for which the coefficient 0 has a 1 in the position p (the position 0 is the position having the weight of $2^0$). For p=1, 2 and 3 and the associated first Wallace Trees E01, E02 and E03 the same procedure is followed.

Wallace Trees are components (for example the component SN 74 LS 275, Texas Instruments), showing the number of "ones" applied to their inputs as a binary number at their outputs.

The sum over p in equation (5) is a linear combination of powers of two, in which combination the coefficients can assume all integral values from 0 to 4. The further Wallace Trees EKO (EKOO, EKO1, EKO2 and EKO3, respectively) shown in the FIG. 1 and arranged in cascade with the first Wallace Trees EO, are used for converting this representation into a binary number representation. The termination of the cascade EKO is formed by a fast first adder EAO (carry look-ahead adder) having a parallel-arranged transfer logic. The cases for which $h_p(k)=-1$ can be treated in the same way as described above. For example, the required components for w=0 are the second Wallace Trees ZO, a second cascade ZKO and a second adder ZAO having a parallel-arranged transfer logic shown as blocks in FIG. 2.

What has been observed with respect to w=0 also holds for the other values of w. The components required are the Wallace Trees E1 to E7 belonging to the first set EW, the cascades EK1 to EK7 belonging to the first cascade EK, the adders EA1 to EA7 belonging to the first adders EA, the Wallace Trees Z1 to Z7 belonging to the second set of Wallace Trees ZW, the cascades ZK1 to ZK7 belonging to the second cascade ZK and the adders ZA1 to ZA7 belonging to the second adders ZA, all of which are also shown as blocks in FIG. 2. If in equation (5), the sum over p for fixed w and for the cases in which $h_p(k)=1$, is designated as $SU^+_w(n)$ and for the cases in which $h_p(k)=-1$ as $-SU^-_w(n)$, equation (5) can be written $$y(n) = \sum_{w=0}^{7} SU_w^+(n) 2^{-w} - \sum_{w=0}^{7} SU_w^-(n) 2^{-w} \quad (6)$$

Figure 2:
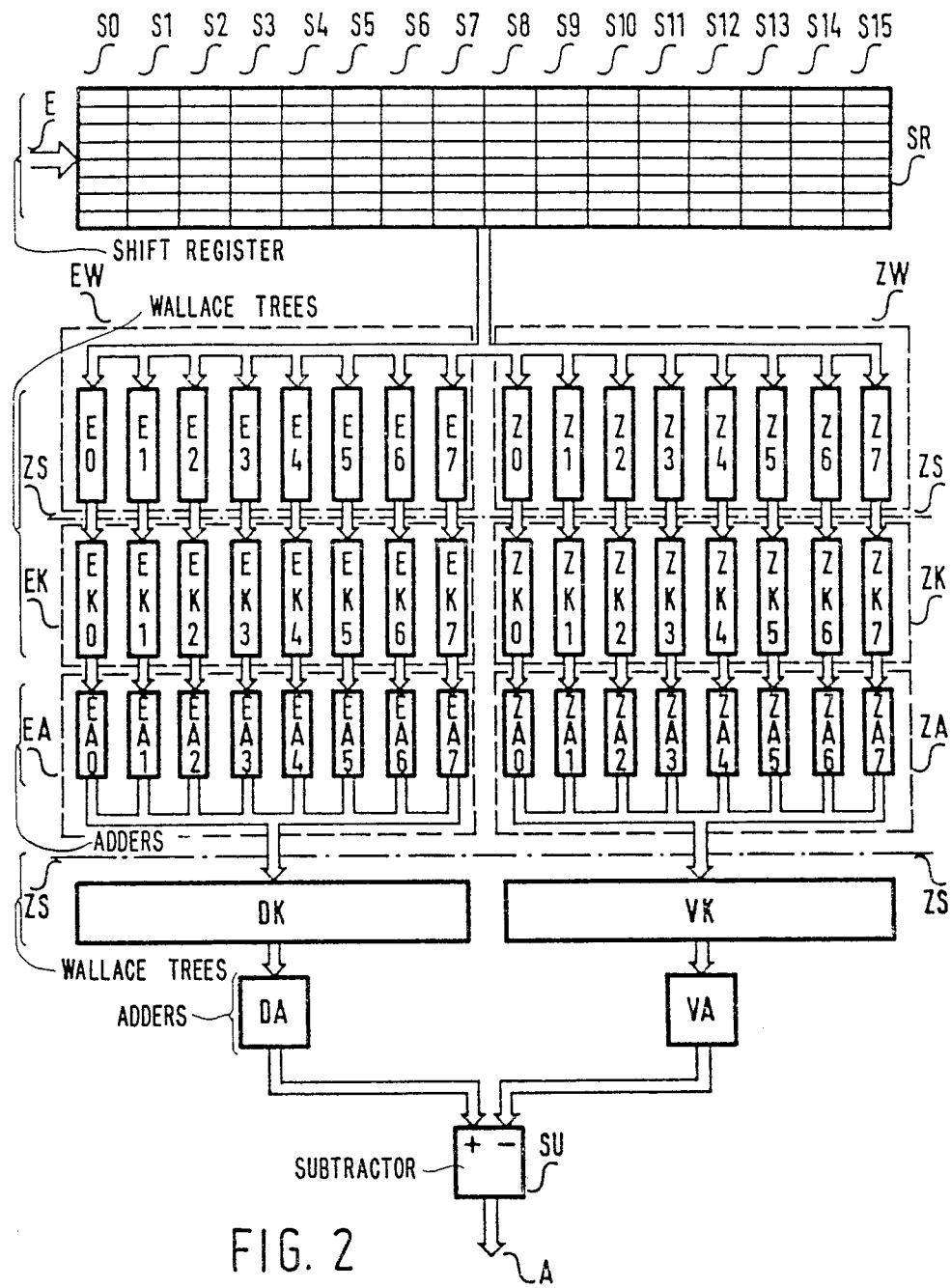
FIG. 2 shows the basic block diagram of an embodiment of the invention.

Here too—as can be recognized from the two terms of equation (6)—it is a matter of converting a linear combination of powers of two having arbitrary integral positive coefficients, into a binary number. The conversion for the two partial sums of (6) takes place separately, that is—as shown in FIG. 2—by a third or fourth cascade of Wallace Trees DK, VK, respectively, terminated by a third or fourth adder DA, VA, respectively, having a parallel transfer logic. Finally, the difference A between the values of the two partial sums is obtained by a fast subtractor SU; the difference A produces the output variable y(n) as a binary number.

In order to increase the processing rate still further, clocked intermediate stores have been inserted between the individual stages—indicated by broken lines ZS. The clock supply for the intermediate stores and for all other components is within the reach of those skilled in the art and will, therefore, not be discussed any further.

As is immediately clear from the above, the number of multiplications and hence the number of components required becomes less, according as the number of ones in the CSD code of the filter coefficients is smaller. Therefore, it is advantageous to utilize the freedom in selecting the filter coefficients—due to the tolerance scheme of the transfer charactristic—in a way such that all coefficients have as many zeroes as possible.

What is claimed is:

1. A digital filter for processing W-bit input code words using K coefficients represented as P-digit code words in CSD code, comprising:
   a. a W-bit wide shift register (SR) having K stages (SO, S1, . . . , S15) for shifting the input code words;
   b. a first plurality of Wallace trees (E0, E1, . . . , E7), including one Wallace tree for each respective p, w pair, where w=0, 1, . . . , W-1 and p=0, 1, . . . , P-1, each of the first plurality of Wallace trees including:
      i. respective input means connected to bit position w of stage k of the shift register, if bit position p of coefficient k is +1, where k=0, 1, . . . K-1; and
      ii. a respective output for providing a number represented as a linear combination of P powers of two;
   c. a second plurality of Wallace trees (Z0, Z1, . . . , Z7), including one Wallace tree for each respective p,w pair, each of the second plurality of Wallace trees including:
      i. respective input means connected to bit positions w of stage k of the shift register, if bit position p of coefficient k is -1; and
      ii. a respective output for providing a number represented as a linear combination of P powers of two;
   d. a third plurality of Wallace trees (EK0, EK1, . . . , EK7), in cascade with the first plurality of Wallace trees, for performing a first stage of converting the numbers at the outputs of the first plurality of Wallace trees into respective binary numbers;
   e. a first plurality of adders (EA0, EA1, . . . , EA7) one for each of the third plurality of Wallace trees, for adding the binary numbers provided at the outputs of the third plurality of Wallace trees and thereby performing a second stage of converting the numbers at the outputs of the first plurality of Wallace trees into respective binary numbers, represented as linear combinations of powers of two;
   f. a fourth plurality of Wallace trees (ZK0, ZK1, . . . , ZK7), in cascade with the second plurality of Wallace trees, for performing the first stage of converting the numbers at the outputs of the second plurality of Wallace trees into respective binary numbers;
   g. a second plurality of adders (ZA0, ZA1, . . . , ZA) one for each of the fourth plurality of Wallace trees, for adding the binary numbers provided at the outputs of the fourth plurality of Wallace trees and thereby performing a second stage of converting the numbers at the outputs of the second plurality of Wallace trees into respective binary numbers, represented as linear combinations of powers of two;
   h. a fifth plurality of Wallace trees (DK) for performing a first stage of converting the numbers provided by the first plurality of adders into combined binary numbers;
   i. a third adder (DA), at an output of the fifth plurality of Wallace trees, for performing a second stage of converting the numbers provided by the first plurality of adders into combined binary numbers;
   j. a sixth plurality of Wallace trees (VK) for performing a first stage of converting the numbers provided by the second plurality of adders into combined binary numbers;
   k. a fourth adder (VA), at an output of the sixth plurality of Wallace trees, for performing a second stage of converting the numbers provided by the second plurality of adders into combined binary numbers; and
   l. a subtracter SU for subtracting numbers appearing at outputs of the third and fourth adders.

2. The filter of claim 1 wherein the adders and subtracters comprise components having parallel transfer logic.

3. The filter of claim 2, comprising a plurality of clocked intermediate stores coupled between the Wallace trees.

4. The filter of claim 1, comprising a plurality of clocked intermediate stores coupled between the Wallace trees.

5. The filter of claim 1, 2, 3, or 4 wherein the filter coefficients are optimized to maximize the number of zeroes in the CSD code, while taking into account a prescribed tolerance scheme of the filter characteristic.

* * * * *